(12) United States Patent
Harada et al.

(10) Patent No.: US 11,968,822 B2
(45) Date of Patent: Apr. 23, 2024

(54) MEMORY DEVICE USING SEMICONDUCTOR ELEMENT

(71) Applicant: Unisantis Electronics Singapore Pte. Ltd., Singapore (SG)

(72) Inventors: Nozomu Harada, Tokyo (JP); Koji Sakui, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 138 days.

(21) Appl. No.: 17/858,558

(22) Filed: Jul. 6, 2022

(65) Prior Publication Data

US 2023/0008471 A1  Jan. 12, 2023

(30) Foreign Application Priority Data

Jul. 9, 2021 (WO) ............... PCT/JP2021/025899

(51) Int. Cl.
| | | |
|---|---|---|
| *G11C 11/4096* | (2006.01) | |
| *G11C 11/404* | (2006.01) | |
| *H10B 12/00* | (2023.01) | |

(52) U.S. Cl.
CPC ............ *H10B 12/20* (2023.02); *G11C 11/404* (2013.01); *G11C 11/4096* (2013.01)

(58) Field of Classification Search
CPC ... H10B 12/20; G11C 11/4096; G11C 11/404; G11C 2211/4016

See application file for complete search history.

(56) References Cited

U.S. PATENT DOCUMENTS

| 11,862,464 B2 * | 1/2024 | Masuoka ............ H01L 21/0335 |
| 2003/0111681 A1 | 7/2003 | Kawanaka |

(Continued)

FOREIGN PATENT DOCUMENTS

| JP | H02-188966 A | 7/1990 |
| JP | H03-171768 A | 7/1991 |

(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka "Impact of Surrounding Gate Transistor (SGT) for Ultra-High Density LSI's", IEEE Transaction on Electron Devices, vol. 38, No. 3, pp. 573-578 (1991).

(Continued)

*Primary Examiner* — Tuan T Nguyen
(74) *Attorney, Agent, or Firm* — Crowell & Moring LLP

(57) ABSTRACT

A first dynamic flash memory cell formed on a first Si pillar $25a$ including an $N^+$ layer $21a$, a P layer $22a$, and an $N^+$ layer $21b$, and a second dynamic flash memory cell formed on a second Si pillar $25b$ including a P layer $22b$ and an $N^+$ layer $21c$, the first dynamic flash memory cell and the second dynamic flash memory cell sharing the $N^+$ layer $21b$ that is connected to a first bit line BL1, are stacked on top of one another on a P-layer substrate 20 to form a dynamic flash memory. In plan view, a first plate line PL1, a first word line WL1, a second word line WL2, and a second plate line PL2 extend in the same direction and are formed to be perpendicular to a direction in which the first bit line BL1 extends.

9 Claims, 9 Drawing Sheets

(56) References Cited

U.S. PATENT DOCUMENTS

| | | | |
|---|---|---|---|
| 2006/0049444 A1 | 3/2006 | Shino | |
| 2006/0157738 A1 | 7/2006 | Kawanaka | |
| 2008/0137394 A1 | 6/2008 | Shimano et al. | |
| 2008/0212366 A1 | 9/2008 | Ohsawa | |
| 2010/0019304 A1* | 1/2010 | Minami | H10B 12/00 257/314 |
| 2010/0148233 A1* | 6/2010 | Fujimoto | H10B 12/053 257/296 |
| 2016/0204251 A1* | 7/2016 | Masuoka | H01L 21/823814 257/329 |
| 2018/0033792 A1* | 2/2018 | Masuoka | H01L 21/28531 |
| 2019/0109140 A1* | 4/2019 | Masuoka | H01L 21/28132 |
| 2021/0119017 A1* | 4/2021 | Masuoka | H01L 29/42392 |
| 2023/0247820 A1* | 8/2023 | Kakumu | H10B 12/20 257/314 |
| 2023/0269924 A1* | 8/2023 | Kakumu | G11C 11/404 365/184 |
| 2024/0015967 A1* | 1/2024 | Cho | H10B 43/27 |

FOREIGN PATENT DOCUMENTS

| | | |
|---|---|---|
| JP | 2003-188279 A | 7/2003 |
| JP | 2006-080280 A | 3/2006 |
| JP | 2008-147514 A | 6/2006 |
| JP | 3957774 B2 | 5/2007 |
| JP | 2008-218556 A | 9/2008 |

OTHER PUBLICATIONS

H. Chung, H. Kim, H. Kim, K. Kim, S. Kim, K. W. Song, J. Kim, Y. C. Oh, Y. Hwang, H. Hong, G. Jin, and C. Chung: "Novel 4F2 Dram Cell with Vertical Pillar Transistor (VPT)," 2011 Proceeding of the European Solid-State Device Research Conference, (2011).

H. S. Philip Wong, S. Raoux, S. Kim, Jiale Liang, J. P. Reifenberg, B. Rajendran, M. Asheghi and K. E. Goodson: "Phase Change Memory," Proceeding of IEEE, vol. 98, No. 12, December, pp. 2201-2227 (2010).

K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V," IEDM (2007) pp. 767-770.

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).

M. G. Ertosun, K. Lim, C. Park, J. Oh, P. Kirsch, and K. C. Saraswat : "Novel Capacitorless Single-Transistor Charge-Trap DRAM (1T CT DRAM) Utilizing Electron," IEEE Electron Device Letter, vol. 31, No. 5, pp. 405-407 (2010).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI", IEICE Trans. Electron, vol. E90-C, No. 4 pp. 765-771 (2007).

International Search Report (PCT/ISA/210) (Japanese) from PCT/JP2021/025899 dated Aug. 17, 2021, 3 pgs.

English translation of International Search Report (PCT/ISA/210) from PCT/JP2021/025899 dated Aug. 17, 2021, 2 pgs.

International Written Opinion (PCT/ISA/237) (Japanese) from PCT/JP2021/025899 dated Aug. 17, 2021, 3 pgs.

* cited by examiner

FIG. 2A "1" WRITE STATE
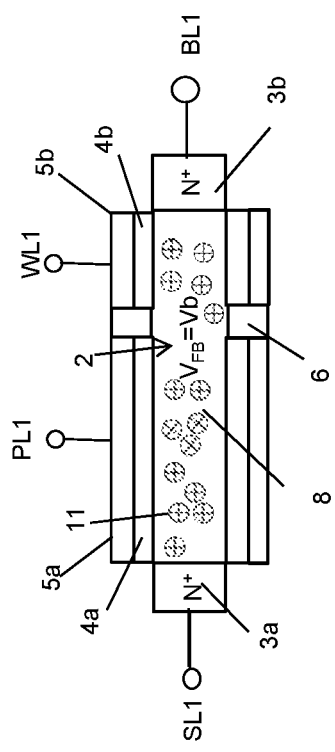
FIG. 2B "0" ERASE OPERATION
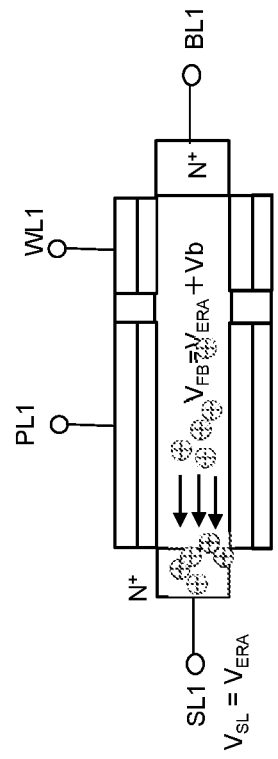
Vb: Built-in Voltage~0.7V
FIG. 2C
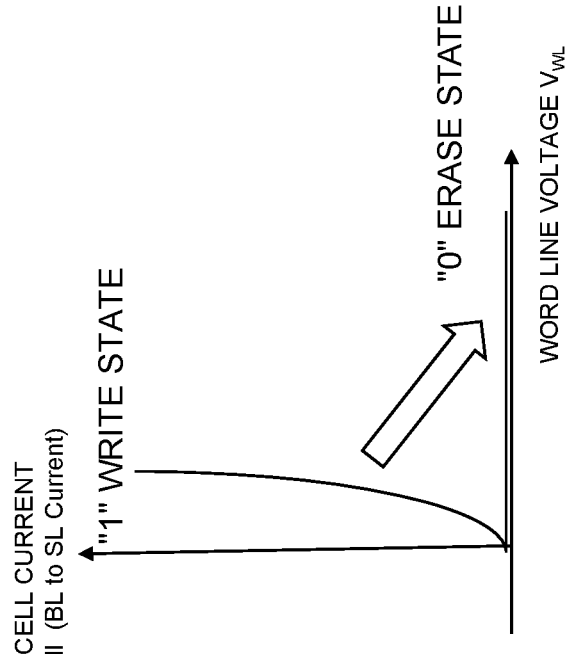

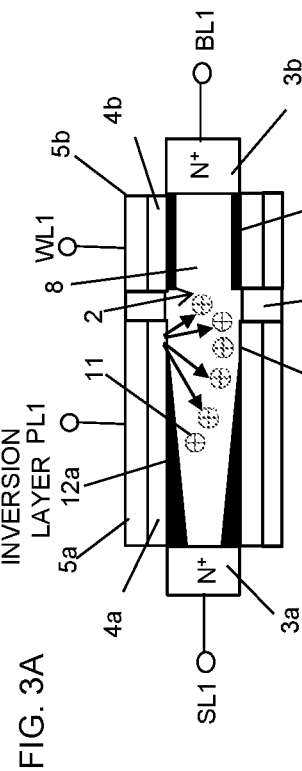
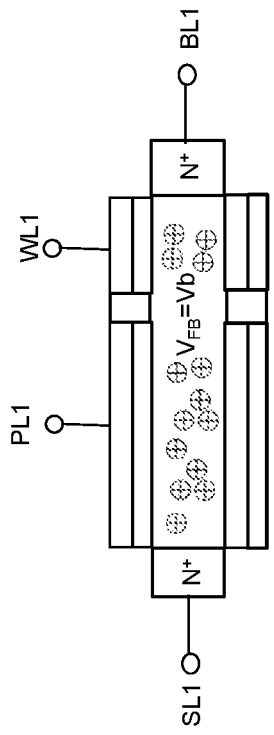
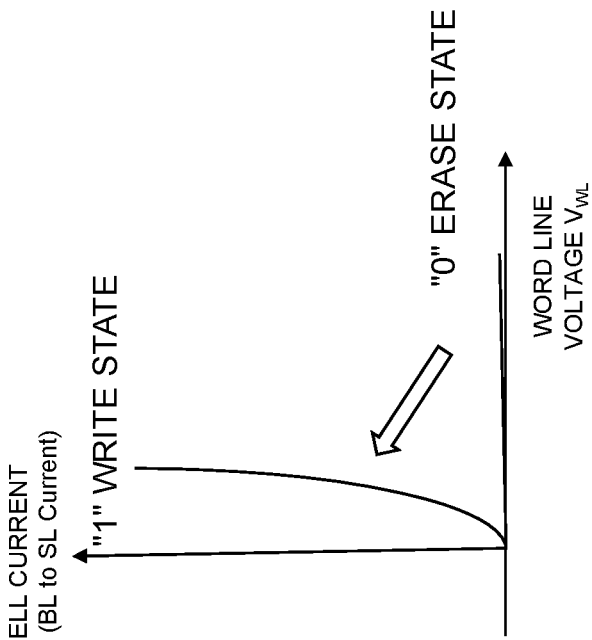
FIG. 3A "1" WRITE OPERATION SOURCE-SIDE IMPACT IONIZATION
FIG. 3B "1" WRITE STATE
FIG. 3C

"1" WRITE STATE

"0" ERASE STATE

FIG. 4BA
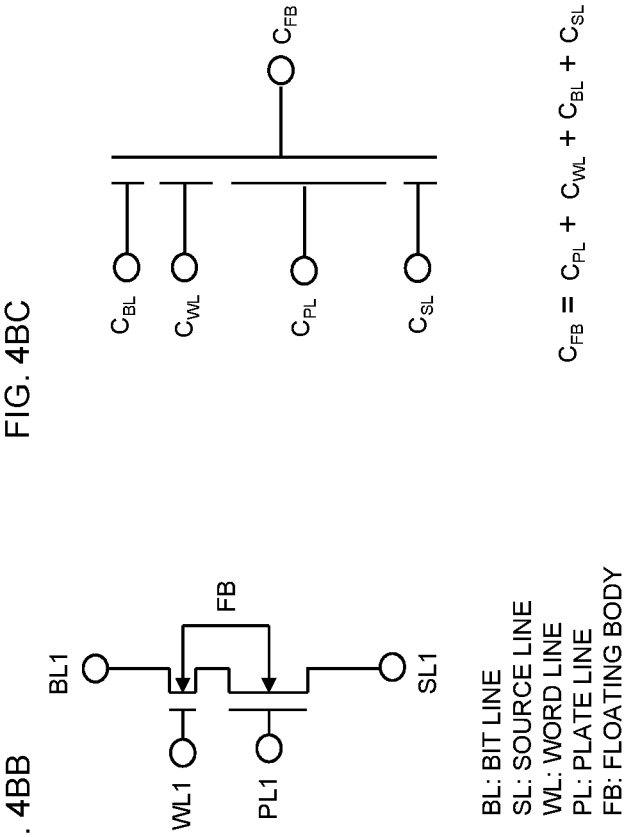
FIG. 4BB
FIG. 4BC
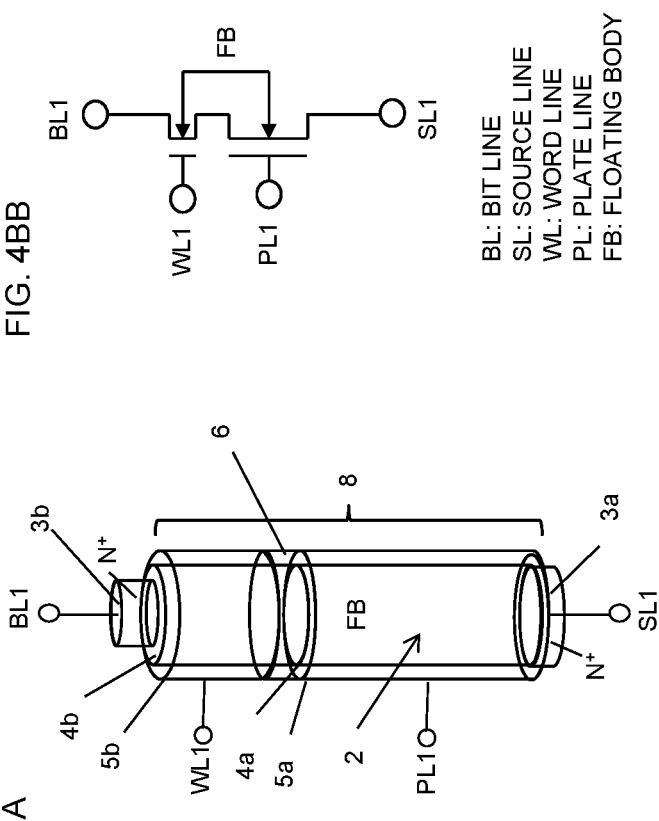
BL: BIT LINE
SL: SOURCE LINE
WL: WORD LINE
PL: PLATE LINE
FB: FLOATING BODY
$$C_{FB} = C_{PL} + C_{WL} + C_{BL} + C_{SL}$$
$$\Delta V_{FB} = V_{FB2} - V_{FB1}$$
$$= \frac{C_{WL}}{C_{PL} + C_{WL} + C_{BL} + C_{SL}} \times V_{ReadWL} \quad (4)$$
FIG. 4BD
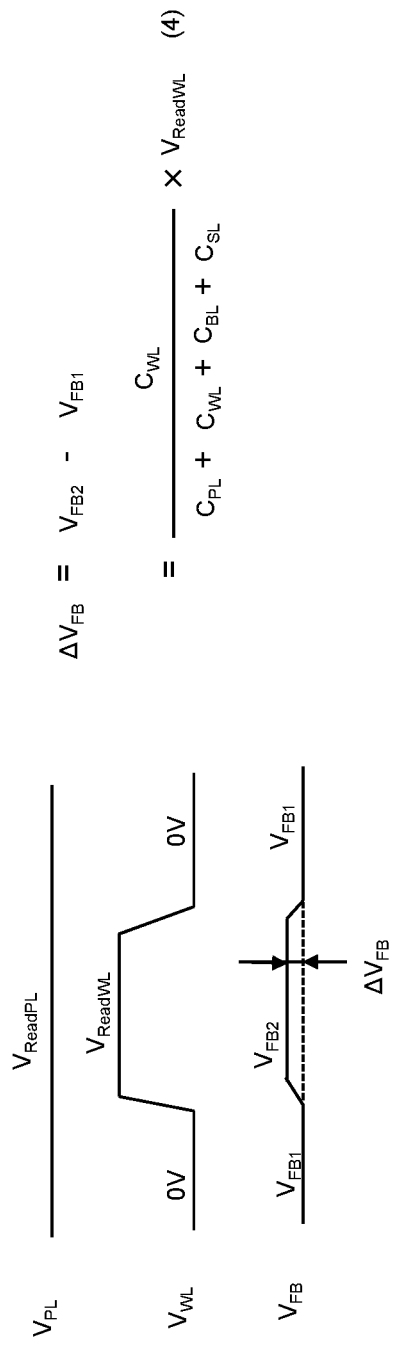

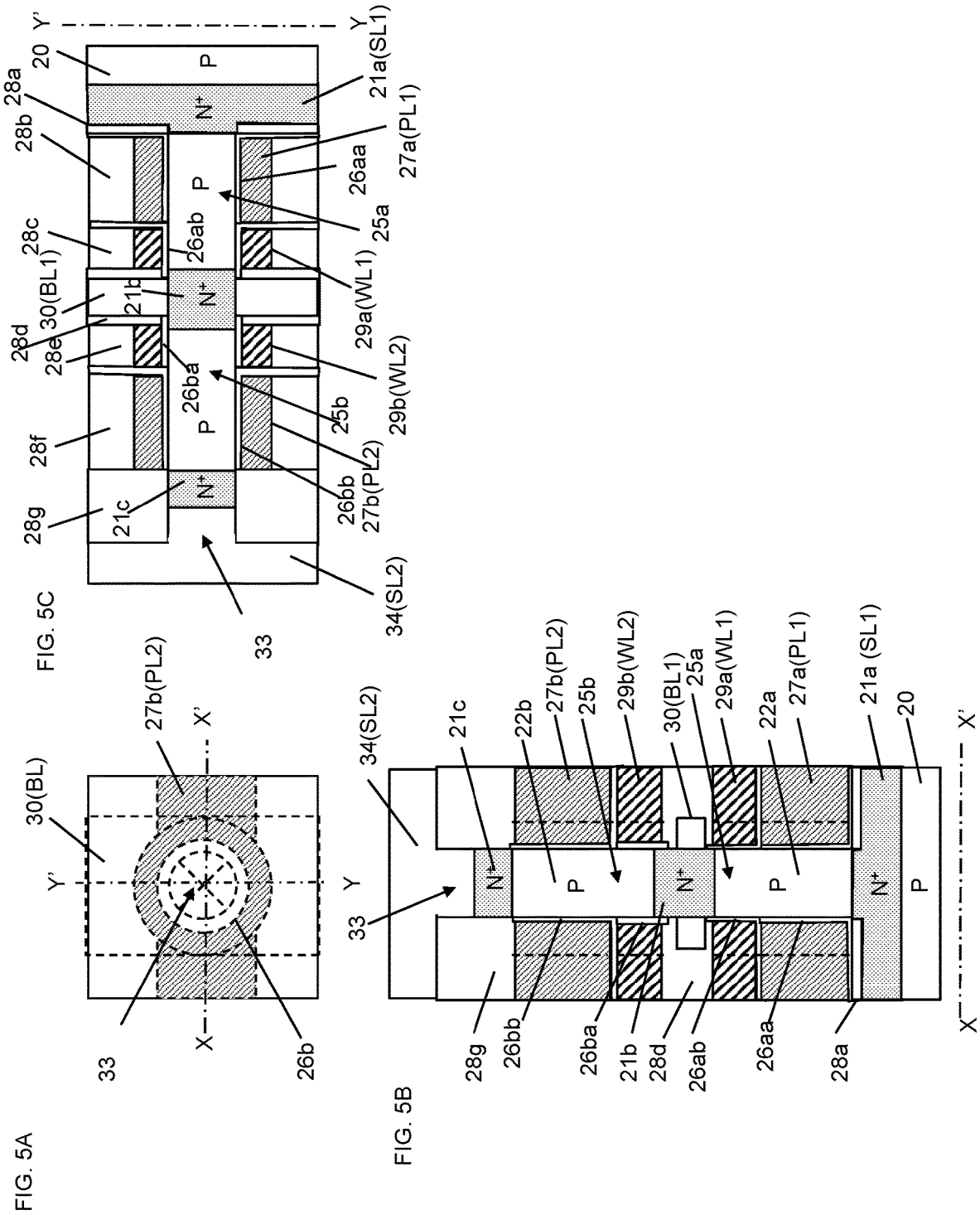

$$\Delta V_{FB} = V_{FB2} - V_{FB1}$$
$$= \frac{C_{WL}}{C_{WL} + C_{BL} + C_{SL}} \times V_{ProgWL} \quad \text{Equation (2)}$$

$$\beta = \frac{C_{WL}}{C_{WL} + C_{BL} + C_{SL}} \quad \text{Equation (3)}$$

$$C_{FB} = C_{WL} + C_{BL} + C_{SL} \quad \text{Equation (1)}$$

US 11,968,822 B2

MEMORY DEVICE USING SEMICONDUCTOR ELEMENT

CROSS-REFERENCE TO RELATED APPLICATIONS

This application claims priority to PCT/JP2021/025899 filed Jul. 9, 2021, the enter content of which is incorporated herein by reference.

TECHNICAL FIELD

The present invention relates to a memory device using a semiconductor element.

BACKGROUND ART

Recent development of LSI (Large Scale Integration) technology requires high integration and high performance of memory elements.

In typical planar MOS transistors, a channel extends in a horizontal direction along an upper surface of a semiconductor substrate. In contrast, a channel of SGTs extends in a direction vertical to the upper surface of the semiconductor substrate (see, for example, PTL 1 and NPL 1). This enables the SGTs to achieve a high-density semiconductor device compared with the planar MOS transistors. Such SGTs can be used as selection transistors to implement high-integration memories such as a DRAM (Dynamic Random Access Memory, see, for example, NPL 2) to which a capacitor is connected, a PCM (Phase Change Memory, see, for example, NPL 3) to which a resistance change element is connected, an RRAM (Resistive Random Access Memory, see, for example, NPL 4), and an MRAM (Magneto-resistive Random Access Memory, see, for example, NPL 5) in which a change in magnetic spin orientation is induced by current to change resistance. Further, a capacitorless DRAM memory cell (see NPL 6) constituted by a single MOS transistor, and the like are available. The present application relates to a dynamic flash memory that does not include a resistance change element or a capacitor and that can be constituted only by MOS transistors.

FIGS. 6A to 6D illustrate a write operation of the capacitorless DRAM memory cell described above, which is constituted by a single MOS transistor, FIGS. 7A and 7B illustrate a problem in operation, and FIGS. 8A to 8C illustrate a read operation (see NPL 7).

FIGS. 6A to 6D illustrate the write operation of the DRAM memory cell. FIG. 6A illustrates a "1" write state. Here, the memory cell is formed on an SOI substrate 100 and is constituted by a source N$^+$ layer 103 (semiconductor regions containing donor impurities at high concentrations are hereinafter referred to as "N$^+$ layers") to which a source line SL is connected, a drain N$^+$ layer 104 to which a bit line BL is connected, a gate conductive layer 105 to which a word line WL is connected, and a floating body 102 of a MOS transistor 110a; the capacitorless DRAM memory cell is constituted by the single MOS transistor 110a. A SiO$_2$ layer 101 of the SOI substrate 100 is immediately below and in contact with the floating body 102. To write "1" to the memory cell constituted by the single MOS transistor 110a, the MOS transistor 110a is operated in a saturation region. That is, an electron channel 107 extending from the source N$^+$ layer 103 has a pinch-off point 108 and does not reach the drain N$^+$ layer 104 to which the bit line BL is connected. When the MOS transistor 110a is operated such that the bit line BL connected to the drain N$^+$ layer 104 and the word line WL connected to the gate conductive layer 105 are both set to be at a high voltage and the gate voltage is set to about ½ of the drain voltage, the electric field strength is maximized at the pinch-off point 108 near the drain N$^+$ layer 104. As a result, accelerated electrons flowing from the source N$^+$ layer 103 toward the drain N$^+$ layer 104 collide with a Si lattice, and the kinetic energy lost at this time causes generation of electron-hole pairs (impact ionization phenomenon). Most of the generated electrons (not illustrated) reach the drain N$^+$ layer 104. A very small number of electrons, which are very hot, jump over a gate oxide film 109 and reach the gate conductive layer 105. Holes 106, which are generated at the same time, charge the floating body 102. In this case, the generated holes 106 contribute as an increment of the majority carriers because the floating body 102 is made of P-type Si. When the floating body 102 is filled with the generated holes 106 and the voltage of the floating body 102 becomes higher than that of the source N$^+$ layer 103 by Vb or more, the generated holes 106 are further discharged to the source N$^+$ layer 103. Here, Vb is the built-in voltage across a PN junction between the source N$^+$ layer 103 and the P-layer floating body 102 and is about 0.7 V. FIG. 6B illustrates a state in which the floating body 102 is charged up to saturation with the generated holes 106.

Next, a "0" write operation of a memory cell 110 will be described with reference to FIG. 6C. A selected word line WL is common to the memory cell 110a for writing "1" and a memory cell 110b for writing "0", which are present randomly. FIG. 6C illustrates a state of rewriting from the "1" write state to a "0" write state. To write "0", the voltage of the bit line BL is set to a negative bias, and the PN junction between the drain N$^+$ layer 104 and the P-layer floating body 102 is forward biased. As a result, the holes 106 in the floating body 102, which are generated in advance in the previous cycle, flow into the drain N$^+$ layer 104 connected to the bit line BL. At the completion of the write operation, the following two memory cell states are obtained: the memory cell 110a filled with the generated holes 106 (FIG. 6B) and the memory cell 110b from which the generated holes 106 are injected (FIG. 6C). The floating body 102 of the memory cell 110a filled with the holes 106 has a higher potential than the floating body 102 having no generated holes. Thus, a threshold voltage of the memory cell 110a is lower than a threshold voltage of the memory cell 110b. This state is illustrated in FIG. 6D.

Next, a problem in the operation of the memory cell constituted by the single MOS transistor will be described with reference to FIGS. 7A and 7B. As illustrated in FIG. 7A, the floating body 102 has a capacitance $C_{FB}$, which is the sum of a capacitance $C_{WL}$ between the gate to which the word line WL is connected and the floating body 102, a junction capacitance $C_{SL}$ of the PN junction between the source N$^+$ layer 103 to which the source line SL is connected and the floating body 102, and a junction capacitance $C_{BL}$ of the PN junction between the drain N$^+$ layer 104 to which the bit line BL is connected and the floating body 102. The capacitance $C_{FB}$ is expressed by the following equation.

$$C_{FB}=C_{WL}+C_{BL}+C_{SL} \quad (1)$$

Accordingly, an oscillation of a word line voltage $V_{WL}$ at the time of writing affects the voltage of the floating body 102 serving as a storage node (junction) of the memory cell. This state is illustrated in FIG. 7B. In response to an increase in the word line voltage $V_{WL}$ from 0 V to $V_{ProgWL}$ at the time of writing, a voltage $V_{FB}$ of the floating body 102 increases from a voltage $V_{FB1}$ in the initial state before the change in the word line voltage $V_{WL}$ to $V_{FB2}$ due to capacitive coupling with the word line WL. The amount of voltage change $\Delta V_{FB}$ is expressed by the following equation.

$$\Delta V_{FB} = V_{FB2} - V_{FB1} = C_{WL}/(C_{WL} + C_{BL} + C_{SL}) \times V_{ProgWL} \quad (2)$$

Here, $$\beta = C_{WL}/(C_{WL}+C_{BL}+C_{SL}) \quad (3)$$

β represents a coupling ratio. In such a memory cell, the contribution ratio of $C_{WL}$ is high, and, for example, $C_{WL}$:$C_{BL}$:$C_{SL}$=8:1:1. In this case, β is equal to 0.8. For example, when the word line WL changes from 5 V at the time of writing to 0 V after the completion of writing, the floating body 102 is subjected to an amplitude noise of 5V×β=4 V due to the capacitive coupling between the word line WL and the floating body 102. This causes a problem that a sufficient potential difference margin is not provided between the "1" potential and the "0" potential of the floating body at the time of writing.

FIGS. 8A to 8C illustrate the read operation. FIG. 8A illustrates a "1" write state, and FIG. 8B illustrates a "0" write state. Actually, however, even if Vb is written in the floating body 102 by "1" writing, the floating body 102 is lowered to a negative bias when the word line WL returns to 0 V in response to the completion of writing. When "0" is written, the floating body 102 is lowered to a further negative bias, which makes it difficult to provide a sufficiently large potential difference margin between "1" and "0" at the time of writing, as illustrated in FIG. 8C. The small operation margin is a major problem of the DRAM memory cell. In addition, another issue is to increase the density of such DRAM memory cells.

CITATION LIST

Patent Literature

[PTL 1] Japanese Unexamined Patent Application Publication No. 2-188966
[PTL 2] Japanese Unexamined Patent Application Publication No. 3-171768
[PTL 3] Japanese Patent No. 3957774

Non Patent Literature

[NPL 1] Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)
[NPL 2] H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)
[NPL 3] H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No 12, December, pp. 2201-2227 (2010)
[NPL 4] T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007)
[NPL 5] W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)
[NPL 6] M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010)
[NPL 7] E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-697, April 2006.

SUMMARY OF INVENTION

Technical Problem

A capacitorless single-transistor DRAM (gain cell) in a memory device using an SGT has a problem that oscillation of the potential of the word line at the time of reading or writing data is directly transmitted as noise to an SGT body in a floating state because the capacitive coupling between the word line and the SGT body is large. This causes a problem of erroneous reading or erroneous rewriting of stored data, and makes it difficult to put a capacitorless single-transistor DRAM (gain cell) into practical use. In addition to overcoming the problems described above, it is necessary to achieve high performance and high density of DRAM memory cells.

Solution to Problem

To address the problems described above, a memory device using a semiconductor element according to the present invention includes:
  a first semiconductor pillar standing on a substrate in a vertical direction to the substrate, the first semiconductor pillar including, from bottom to top, a first impurity layer, a first semiconductor layer, and a second impurity layer;
  a second semiconductor pillar on top of the first semiconductor pillar in such a manner as to be connected to the first semiconductor pillar in the vertical direction, the second semiconductor pillar including, from bottom to top, the second impurity layer, a second semiconductor layer, and a third impurity layer, the second impurity layer being shared with the first semiconductor pillar;
  a first gate insulating layer surrounding a lower portion of the first semiconductor pillar;
  a first gate conductor layer surrounding the first gate insulating layer;
  a second gate insulating layer surrounding an upper portion of the first semiconductor pillar;
  a second gate conductor layer surrounding the second gate insulating layer;
  a third gate insulating layer surrounding a lower portion of the second semiconductor pillar;
  a third gate conductor layer surrounding the third gate insulating layer;
  a fourth gate insulating layer surrounding an upper portion of the second semiconductor pillar; and
  a fourth gate conductor layer surrounding the fourth gate insulating layer.

the memory device is configured to perform:
a data write operation for controlling voltages to be applied to the first gate conductor layer, the second gate conductor layer, the third gate conductor layer, the fourth gate conductor layer, the first impurity layer, the second impurity layer, and the third impurity layer to form, in both or one of the first semiconductor layer and the second semiconductor layer, a hole group or an electron group serving as majority carriers of both of the first semiconductor layer and the second semiconductor layer, the hole group or the electron group being formed by an impact ionization phenomenon or a gate induced drain leakage current, and to hold the formed hole group or electron group in both or one of the first semiconductor layer and the second semiconductor layer; and
a data erase operation for controlling the voltages to be applied to the first gate conductor layer, the second gate conductor layer, the third gate conductor layer, the fourth gate conductor layer, the first impurity layer, the second impurity layer, and the third impurity layer to discharge the hole group or the electron group serving as majority carriers from within both or one of the first semiconductor layer and the second semiconductor layer (first aspect of the invention).

A second aspect of the invention provides the memory device according to the first aspect of the invention described above, in which
the first impurity layer is connected to a first source line,
the first gate conductor layer is connected to a first plate line,
the second gate conductor layer is connected to a first word line,
the second impurity layer is connected to a first bit line,
the third gate conductor layer is connected to a second word line,
the fourth gate conductor layer is connected to a second plate line,
the third impurity layer is connected to a second source line, and
in plan view, the first word line and the second word line extend in a first direction, and the first bit line extends in a second direction perpendicular to the first direction (second aspect of the invention).

A third aspect of the invention provides the memory device according to the first aspect of the invention described above, in which
the first impurity layer is connected to a first source line,
the first gate conductor layer is connected to a first word line,
the second gate conductor layer is connected to a first plate line,
the second impurity layer is connected to a first bit line,
the third gate conductor layer is connected to a second plate line,
the fourth gate conductor layer is connected to a second word line,
the third impurity layer is connected to a second source line, and
in plan view, the first word line and the second word line extend in a first direction, and the first bit line extends in a second direction perpendicular to the first direction (third aspect of the invention).

A fourth aspect of the invention provides the memory device according to the first aspect of the invention described above, in which
the first impurity layer is connected to a first bit line,
the first gate conductor layer is connected to a first word line,
the second gate conductor layer is connected to a first plate line,
the second impurity layer is connected to a first source line,
the third gate conductor layer is connected to a second plate line,
the fourth gate conductor layer is connected to a second word line,
the third impurity layer is connected to a second bit line, and
in plan view, the first word line and the second word line extend in a first direction, and the first bit line and the second bit line extend in a second direction perpendicular to the first direction (fourth aspect of the invention).

A fifth aspect of the invention provides the memory device according to the first aspect of the invention described above, in which
the first impurity layer is connected to a first bit line,
the first gate conductor layer is connected to a first plate line,
the second gate conductor layer is connected to a first word line,
the second impurity layer is connected to a first source line,
the third gate conductor layer is connected to a second word line,
the fourth gate conductor layer is connected to a second plate line,
the third impurity layer is connected to a second bit line, and
in plan view, the first word line and the second word line extend in a first direction, and the first bit line and the second bit line extend in a second direction perpendicular to the first direction (fifth aspect of the invention).

A sixth aspect of the invention provides the memory device according to the first aspect of the invention described above, in which the first gate conductor layer and the fourth gate conductor layer are formed of the same conductive material layer, and the second gate conductor layer and the third gate conductor layer are formed of the same conductive material layer (sixth aspect of the invention).

A seventh aspect of the invention provides the memory device according to the first aspect of the invention described above, in which the first gate insulating layer and the fourth gate insulating layer are formed of the same insulating material layer, and the second gate insulating layer and the third gate insulating layer are formed of the same insulating material layer (seventh aspect of the invention).

An eighth aspect of the invention provides the memory device according to the first aspect of the invention described above, in which
a first gate capacitance between the first gate conductor layer and the first semiconductor layer is larger than a second gate capacitance between the second gate conductor layer and the second semiconductor layer, and
a third gate capacitance between the third gate conductor layer and the second semiconductor layer is smaller than a fourth gate capacitance between the fourth gate conductor layer and the second semiconductor layer (eighth aspect of the invention).

A ninth aspect of the invention provides the memory device according to the first aspect of the invention described above, in which the first gate capacitance and the fourth gate capacitance are equal to each other, and the second gate capacitance and the third gate capacitance are equal to each other (ninth aspect of the invention).

BRIEF DESCRIPTION OF DRAWINGS

FIGS. 2A, 2B, and 2C are diagrams for describing an erase operation mechanism of the memory device including an SGT according to the first embodiment.

FIGS. 3A, 3B, and 3C are diagrams for describing a write operation mechanism of the memory device including an SGT according to the first embodiment.

FIGS. 4BA, 4BB, 4BC, and 4BD are diagrams for describing the read operation mechanism of the memory device including an SGT according to the first embodiment.

FIGS. 5A, 5B, and 5C are structural diagrams illustrating the memory device including an SGT according to the first embodiment.

DESCRIPTION OF EMBODIMENTS

Hereinafter, the structure of a memory device using a semiconductor element (hereinafter referred to as a dynamic flash memory) according to the present invention, a driving method thereof, and a method for manufacturing the memory device will be described with reference to the drawings.

First Embodiment

The structure and operation mechanism of a first dynamic flash memory cell according to a first embodiment of the present invention, and a method for manufacturing the first dynamic flash memory cell will be described with reference to FIGS. 1 to 5C. The structure of the first dynamic flash memory cell will be described with reference to FIG. 1. A data erasing mechanism will be described with reference to FIGS. 2A to 2C, a data writing mechanism will be described with reference to FIGS. 3A to 3C, and a data reading mechanism will be described with reference to FIGS. 4AA to 4BD. A dynamic flash memory having a structure in which the first dynamic flash memory cell is overlaid with a second dynamic flash memory cell will be described with reference to FIGS. 5A to 5C.

Figure 1:
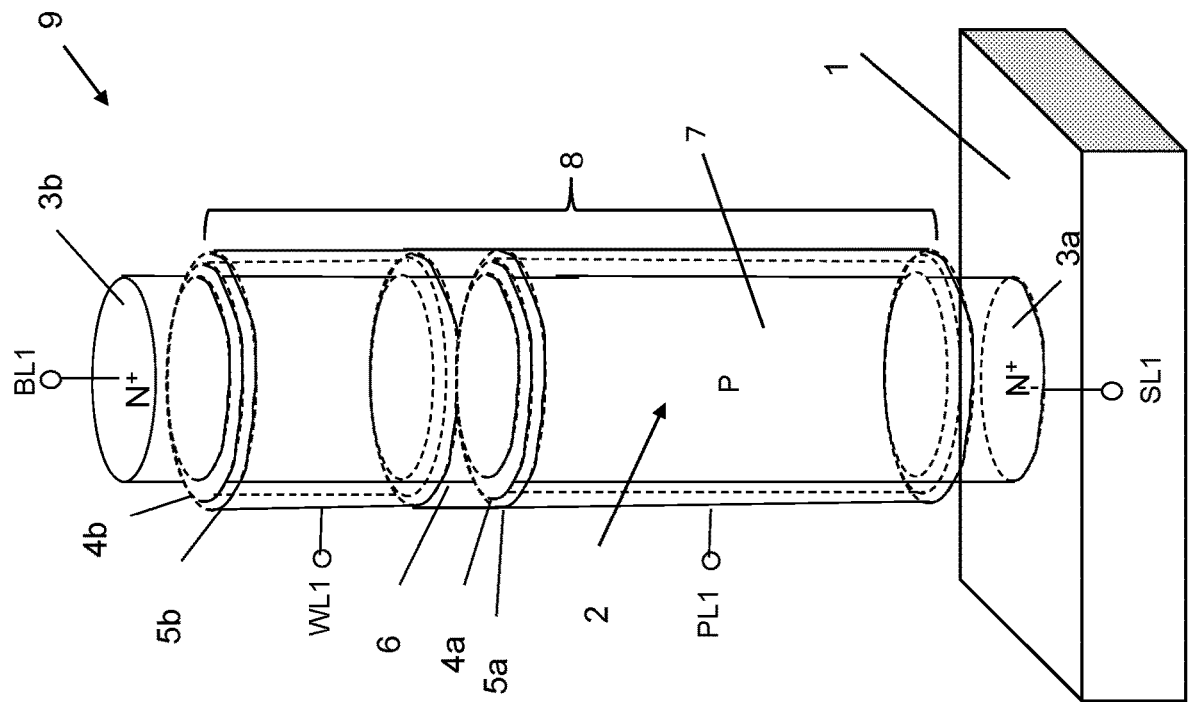
FIG. 1 is a structural diagram of a memory device including an SGT according to a first embodiment.

FIG. 1 illustrates the structure of a dynamic flash memory cell according to the first embodiment of the present invention. A substrate 1 (an example of a "substrate" in the claims) has thereon a first silicon semiconductor pillar (an example of a "first semiconductor pillar" in the claims) (silicon semiconductor pillars are hereinafter referred to as "Si pillars"). The first Si pillar 2 includes, from bottom to top, an $N^+$ layer 3a (an example of a "first impurity layer" in the claims), a P layer 7 (a semiconductor region having an acceptor impurity is hereinafter referred to as "P layer"), and an $N^+$ layer 3b (an example of a "second impurity layer" in the claims). The P layer 7 between the $N^+$ layers 3a and 3b serves as a channel region 8. A first gate insulating layer 4a (an example of a "first gate insulating layer" in the claims) surrounds a lower portion of the first Si pillar 2, and a second gate insulating layer 4b (an example of a "second gate insulating layer" in the claims) surrounds an upper portion of the first Si pillar 2. A first gate conductor layer 5a (an example of a "first gate conductor layer" in the claims) surrounds the first gate insulating layer 4a, and a second gate conductor layer 5b (an example of a "second gate conductor layer" in the claims) surrounds the second gate insulating layer 4b. The first gate conductor layer 5a and the second gate conductor layer 5b are isolated from each other by an insulating layer 6. Accordingly, a first dynamic flash memory cell 9 composed of the $N^+$ layers 3a and 3b, the P layer 7, the first gate insulating layer 4a, the second gate insulating layer 4b, the first gate conductor layer 5a, and the second gate conductor layer 5b is formed.

As illustrated in FIG. 1, the $N^+$ layer 3a is connected to a first source line SL1 (an example of a "first source line" in the claims), the $N^+$ layer 3b is connected to a first bit line BL1 (an example of a "first bit line" in the claims), the first gate conductor layer 5a is connected to a first plate line PL1 (an example of a "first plate line" in the claims), and the second gate conductor layer 5b is connected to a first word line WL1 (an example of a "first word line" in the claims).

A plurality of stages of first dynamic flash memory cells 9, each of which is illustrated in FIG. 1, are stacked on top of one another in the vertical direction. In this case, in plan view, a plate-line conductor layer in each stage extends in the same direction as the first gate conductor layer, a word-line conductor layer in each stage extends in the same direction as the second gate conductor layer 5b, and the word-line conductor layer and the plate-line conductor layer in each stage extend in the same direction.

It is desirable to achieve a structure in which the first gate conductor layer 5a connected to the first plate line PL1 has a larger gate capacitance than the second gate conductor layer 5b connected to the first word line WL1.

Alternatively, the first gate conductor layer 5a may be divided into two or more portions, which are operated synchronously or asynchronously as conductive electrodes for the first plate line PL1. Likewise, the second gate conductor layer 5b may be divided into two or more portions, which are operated synchronously or asynchronously as conductive electrodes for the first word line WL1. This also allows a dynamic flash memory operation to be performed.

A data erase operation mechanism will be described with reference to FIGS. 2A to 2C. The channel region 8 between the $N^+$ layers 3a and 3b is electrically isolated from the substrate 1 and serves as a floating body. FIG. 2A illustrates a state in which a hole group 11 generated by impact ionization in the previous cycle is stored in the channel region 8 before an erase operation is performed. The hole group 11 is mainly accumulated in the P layer 7 in FIG. 1, which is the channel region 8.

At the time of the erase operation, as illustrated in FIG. 2B, the voltage of the first source line SL1 is set to a negative voltage $V_{ERA}$. Here, $V_{ERA}$ is −3 V, for example. As a result, the PN junction between the channel region 8 and the $N^+$ layer 3a serving as the source to which the first source line SL1 is connected is forward biased regardless of the value of an initial potential of the channel region 8. As a result, the hole group 11 stored in the channel region 8, which is generated by impact ionization in the previous cycle, is drawn into the N+ layer 3a corresponding to the source portion, and the channel region 8 has a potential $V_{FB}$, which is given by $V_{FB}=V_{ERA}+Vb$. Here, Vb is the built-in voltage across the PN junction and is about 0.7 V. When $V_{ERA}=-3$ V, the potential of the channel region 8 is −2.3 V. This value corresponds to the potential state of the channel region 8 in a data erase state. If the potential of the channel region 8 serving as the floating body becomes a negative voltage, the threshold voltage of an N-channel MOS transistor of the first dynamic flash memory cell 9 increases due to a substrate bias effect. This increases the threshold voltage of the second gate conductor layer 5b to which the first word line WL1 is connected, as illustrated in FIG. 2C. The erase state of the channel region 8 corresponds to logical storage data "0". The condition of the voltages to be applied to the first bit line BL1, the first source line SL1, the first word line WL1, and the first plate line PL1, described above, and the potential of the floating body are an example for performing the data erase operation, and other operation conditions under which the data erase operation can be performed may be used.

FIGS. 3A to 3C illustrate a data write operation of the first dynamic flash memory cell. As illustrated in FIG. 3A, for example, 0 V is input to the N+ layer 3a to which the first source line SL1 is connected, for example, 3 V is input to the N+ layer 3b to which the first bit line BL1 is connected, for example, 2 V is input to the first gate conductor layer 5a to which the first plate line PL1 is connected, and, for example, 5 V is input to the second gate conductor layer 5b to which the first word line WL1 is connected. As a result, as illustrated in FIG. 3A, an annular inversion layer 12a is formed in the channel region 8 inside the first gate conductor layer 5a to which the first plate line PL1 is connected, and a first N-channel MOS transistor region composed of the channel region 8 surrounded by the first gate conductor layer 5a is operated in a saturation region. This results in generation of a pinch-off point 13 in the inversion layer 12a on the inner side of the first gate conductor layer 5a to which the first plate line PL1 is connected. In contrast, a second N-channel MOS transistor region including the second gate conductor layer 5b to which the first word line WL1 is connected is operated in a linear region. This results in formation of an inversion layer 12b, without a pinch-off point, over an entire surface of the channel region 8 inside the second gate conductor layer 5b to which the first word line WL1 is connected. As a result, the electric field is maximized in a first boundary region of the channel region 8 between the first N-channel MOS transistor region including the first gate conductor layer 5a and the second N-channel MOS transistor region including the second gate conductor layer 5b, which are connected in series, and an impact ionization phenomenon occurs in this region. In this impact ionization phenomenon, accelerated electrons flowing from the N+ layer 3a to which the first source line SL1 is connected to the N+ layer 3b to which the first bit line BL1 is connected collide with lattice Si atoms, and the kinetic energy of the collision generates electron-hole pairs. Some of the generated electrons flow to the first gate conductor layer 5a and the second gate conductor layer 5b, but most of them flow to the N+ layer 3b to which the first bit line BL1 is connected. In "1" writing, electron-hole pairs may be generated using a gate induced drain leakage (GIDL) current, and the floating body FB (see FIG. 4BA) may be filled with the generated hole group (see, for example, NPL 7).

As illustrated in FIG. 3B, the generated hole group 11, which is majority carriers in the channel region 8, charges the channel region 8 to a positive bias. Since the N+ layer 3a to which the first source line SL1 is connected is at 0 V, the channel region 8 is charged to the built-in voltage Vb (about 0.7 V) of the PN junction between the channel region 8 and the N+ layer 3a to which the first source line SL1 is connected. Upon the channel region 8 being charged to a positive bias, the threshold voltages of the first N-channel MOS transistor region and the second N-channel MOS transistor region are decreased due to the substrate bias effect. This results in a decrease in the threshold voltage of the second N-channel MOS transistor region to which the first word line WL1 is connected, as illustrated in FIG. 3C. The data write state of the channel region 8 is assigned to the logical storage data "1".

At the time of the write operation, electron-hole pairs may be generated by the impact ionization phenomenon or the GIDL current in a second boundary region between the N+ layer 3a and the channel region 8 or in a third boundary region between the N+ layer 3b and the channel region 8, instead of in the first boundary region described above, and the channel region 8 may be charged with the generated hole group 11. The condition of the voltages to be applied to the first bit line BL1, the first source line SL1, the first word line WL1, and the first plate line PL1, described above, is an example for performing the data write operation, and other operation conditions under which the data write operation can be performed may be used.

Figure 4A:
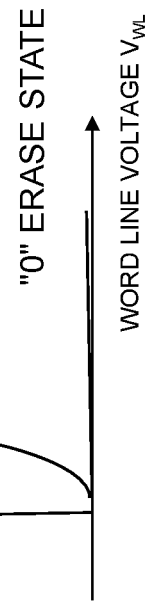
FIGS. 4AA, 4AB, and 4AC are diagrams for describing a read operation mechanism of the memory device including an SGT according to the first embodiment.
Figure 4A:
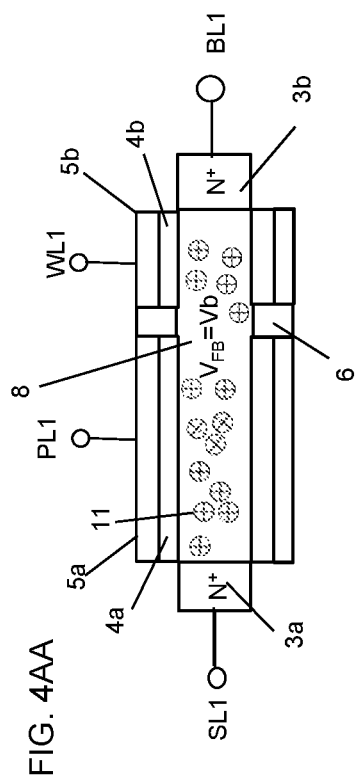
Figure 4A:
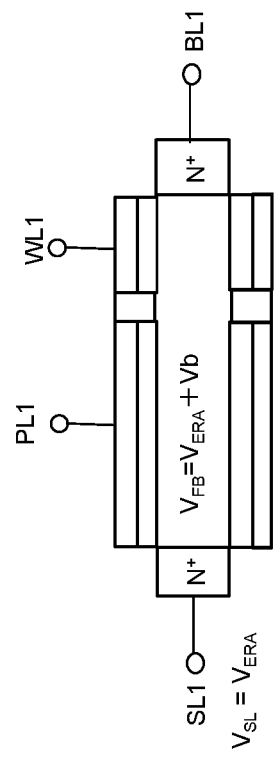
Figure 6B:
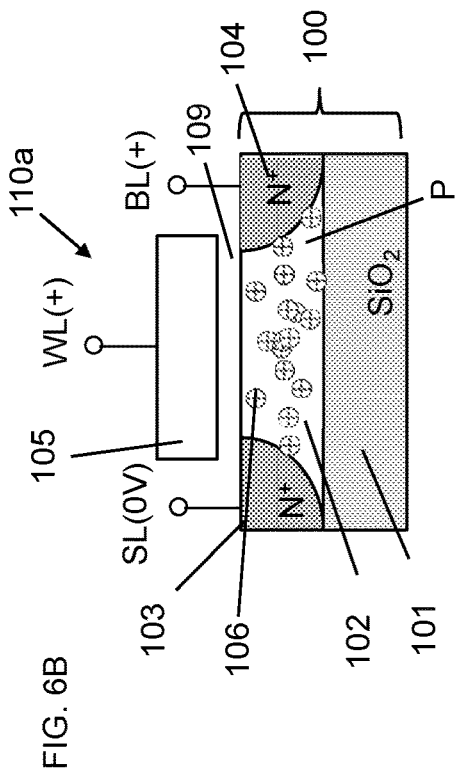
FIGS. 6A, 6B, 6C, and 6D are diagrams illustrating a write operation of a capacitorless DRAM memory cell of the related art.
Figure 6D:
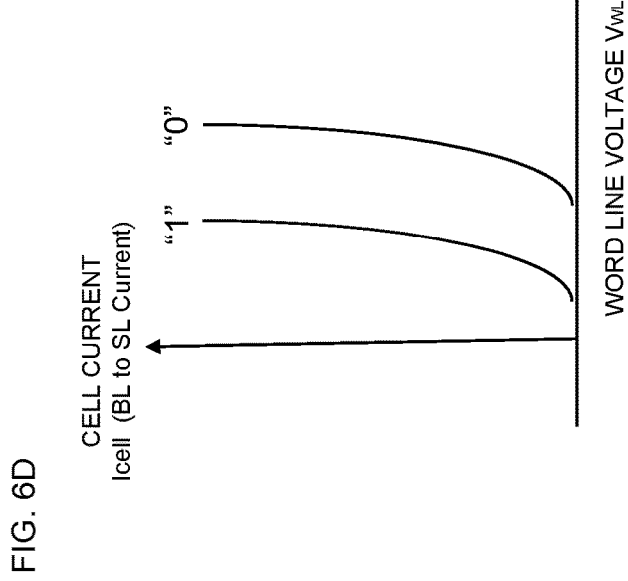
Figure 6A:
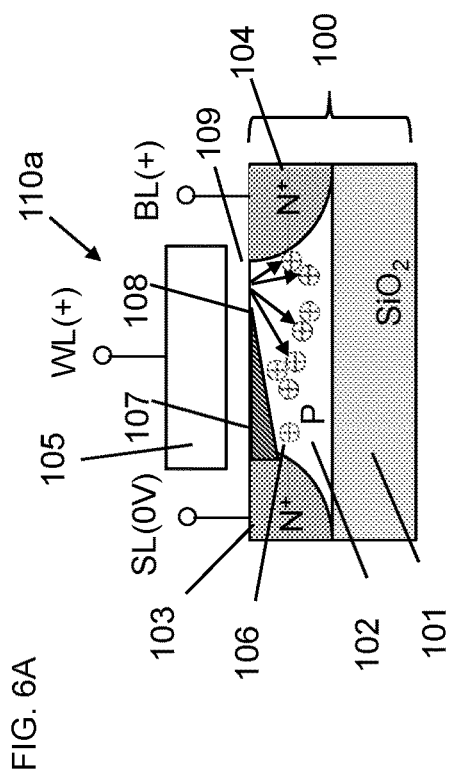
Figure 6C:
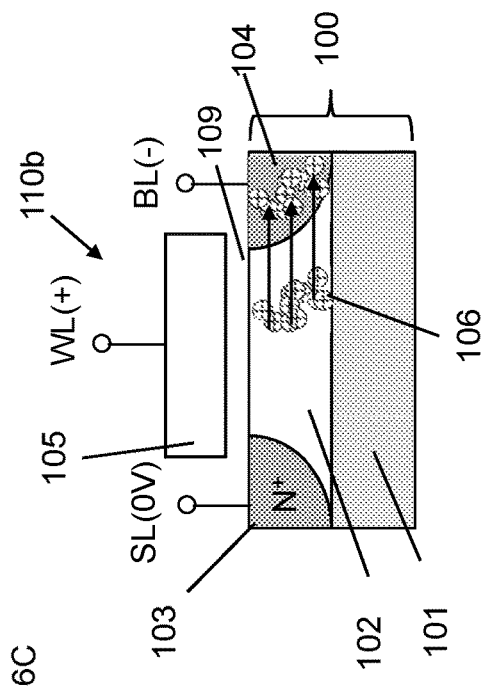
Figure 7B:
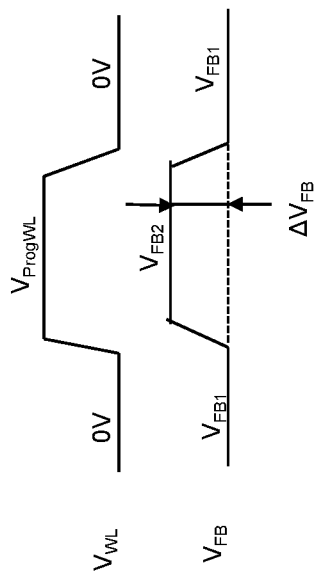
FIGS. 7A and 7B are diagrams for describing a problem in the operation of the capacitorless DRAM memory cell of the related art.
Figure 7A:
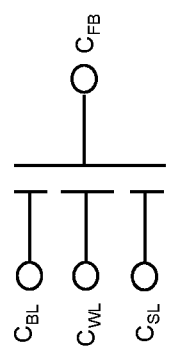
Figure 8C:
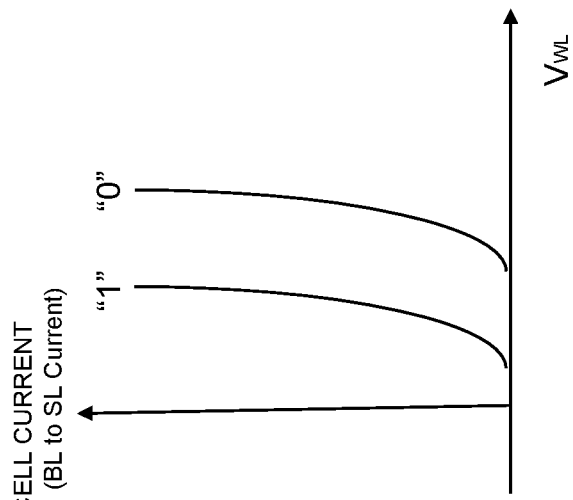
FIGS. 8A, 8B, and 8C are diagrams illustrating a read operation of the capacitorless DRAM memory cell of the related art.
Figure 8A:
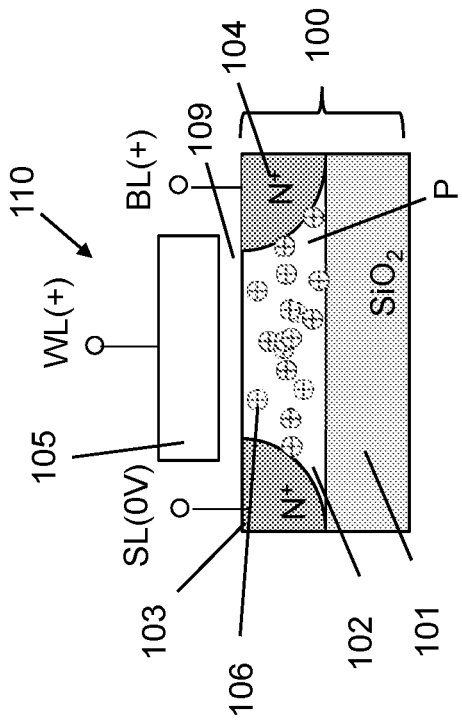
Figure 8B:
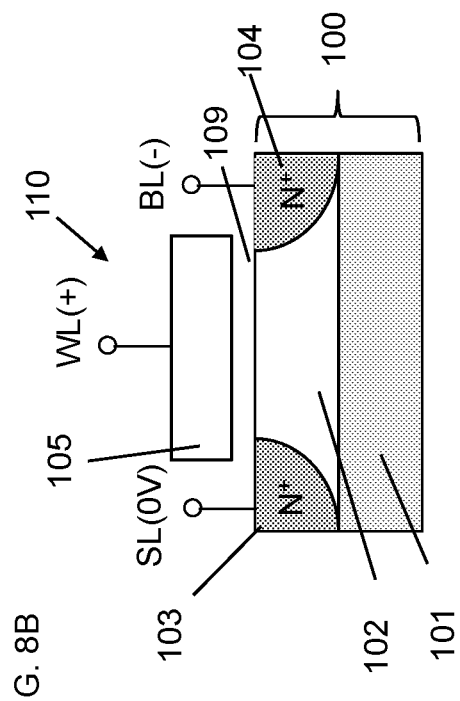

A data read operation of the first dynamic flash memory cell will be described with reference to FIGS. 4AA to 4BD. The read operation of the first dynamic flash memory cell will be described with reference to FIG. 4AA to FIG. 4AC. As illustrated in FIG. 4AA, upon the channel region 8 being charged to the built-in voltage Vb (about 0.7 V), the threshold voltages of the N-channel MOS transistors are decreased due to the substrate bias effect. This state is assigned to the logical storage data "1". As illustrated in FIG. 4AB, when the memory block to be selected before data writing is performed is in the erase state "0" in advance, the channel region 8 is at a floating voltage $V_{FB}$, which is given by $V_{ERA}+Vb$. Through the data write operation, the write state "1" is stored randomly. As a result, logical storage data of logic "0" and "1" is created for the first word line WL1. As illustrated in FIG. 4AC, the difference between the two threshold voltages for the first word line WL1 is used to perform reading by using a sense amplifier. In data reading, the voltage to be applied to the first gate conductor layer 5a connected to the plate line PL1 is set to be higher than the threshold voltage at the time of logical storage data "1" and lower than the threshold voltage at the time of logical storage data "0", whereby a characteristic is obtained in which, as illustrated in FIG. 4AC, no current flows even when the voltage of the word line WL is increased in reading of the logical storage data "0".

Referring to FIG. 4BA to FIG. 4BD, a description will be given of the magnitude relationship of the gate capacitance between the two gate conductor layers, namely, the first gate conductor layer 5a and the second gate conductor layer 5b, at the time of the data read operation of the first dynamic flash memory cell, and the operation related thereto. The gate capacitance of the second gate conductor layer 5b to which the first word line WL1 is connected is desirably designed to be smaller than the gate capacitance of the first gate conductor layer 5a to which the first plate line PL1 is connected. As illustrated in FIG. 4BA, the vertical length of the first gate conductor layer 5a to which the first plate line PL1 is connected is set to be longer than the vertical length of the second gate conductor layer 5b to which the first word line WL1 is connected to make the gate capacitance of the second gate conductor layer 5b to which the first word line WL1 is connected smaller than the gate capacitance of the first gate conductor layer 5a to which the first plate line PL1 is connected. FIG. 4BB illustrates an equivalent circuit of one first dynamic flash memory cell illustrated in FIG. 4BA. FIG. 4BC illustrates a coupling capacitance relationship of the first dynamic flash memory cell. Here, $C_{WL}$ is the capacitance of the second gate conductor layer 5b, $C_{PL}$ is the capacitance of the first gate conductor layer 5a, $C_{BL}$ is the capacitance of the PN junction between the channel region 8 and the N$^+$ layer 3b serving as the drain, and $C_{SL}$ is the capacitance of the PN junction between the channel region 8 and the N$^+$ layer 3a serving as the source. As illustrated in FIG. 4BD, an oscillation of the voltage of the first word line WL1 affects the channel region 8 as noise. A potential variation $\Delta V_{FB}$ of the channel region 8 at this time is expressed by the following equation.

$$\Delta V_{FB} = C_{WL}/(C_{PL} + C_{WL} + C_{BL} + C_{SL}) \times V_{ReadWL} \tag{4}$$

Here, $V_{ReadWL}$ is the oscillating potential of the first word line WL1 at the time of reading. As is apparent from Equation (4), a reduction in the contribution ratio of $C_{WL}$ compared with the total capacitance $C_{PL} + C_{WL} + C_{BL} + C_{SL}$ of the channel region 8 decreases $\Delta V_{FB}$. The vertical length of the first gate conductor layer 5a to which the first plate line PL1 is connected may further be set to be longer than the vertical length of the second gate conductor layer 5b to which the first word line WL1 is connected to further decrease $\Delta V_{FB}$ without reducing the degree of integration of memory cells in plan view. The condition of the voltages to be applied to the first bit line BL1, the first source line SL1, the first word line WL1, and the first plate line PL1, described above, and the potential of the floating body are an example for performing the read operation, and other operation conditions under which the data read operation can be performed may be used. This data read operation may be performed using a bipolar operation.

FIGS. 5A to 5C illustrate the structure of two stages of dynamic flash memory cells in which the first dynamic flash memory cell is overlaid with a second dynamic flash memory cell. FIG. 5A is a plan view of the dynamic flash memory cells. FIG. 5B is a vertical cross-sectional view taken along line X-X' in FIG. 5A. FIG. 5C is a vertical cross-sectional view taken along line Y-Y' in FIG. 5A. In an actual dynamic flash memory device, a large number of dynamic flash memory cells are formed so as to be two-dimensionally arranged.

A first Si pillar 25a (an example of a "first semiconductor pillar" in the claims) is formed on a P-layer substrate 20 (an example of a "substrate" in the claims). The first Si pillar 25a is formed of, from bottom to top, an N$^+$ layer 21a (an example of a "first impurity layer" in the claims), a P layer 22a (an example of a "first semiconductor layer" in the claims), and an N$^+$ layer 21b (an example of a "second impurity layer" in the claims). A first gate insulating layer 26aa (an example of a "first gate insulating layer" in the claims) is formed so as to surround a lower portion of the first Si pillar 25a. The first gate insulating layer 26aa is surrounded by a first gate conductor layer 27a (an example of a "first gate conductor layer" in the claims). A second gate insulating layer 26ab (an example of a "second gate insulating layer" in the claims) is formed so as to surround an upper portion of the first Si pillar 25a. The second gate insulating layer 26ab is surrounded by a second gate conductor layer 29a (an example of a "second gate conductor layer" in the claims). The first gate conductor layer 27a and the second gate conductor layer 29a are separated from each other by the second gate insulating layer 26ab, which is formed so as to be continuous over an upper surface of the first gate conductor layer 27a. A first wiring conductor layer 30 connected to the N$^+$ layer 21b is formed.

A second Si pillar 25b (an example of a "second semiconductor pillar" in the claims) is formed on top of the N$^+$ layer 21b. The second Si pillar 25b is formed of, from bottom to top, a P layer 22b (an example of a "second semiconductor layer" in the claims) and an N$^+$ layer 21c (an example of a "third impurity layer" in the claims). A third gate insulating layer 26ba (an example of a "third gate insulating layer" in the claims) is formed so as to surround a lower portion of the second Si pillar 25b. The third gate insulating layer 26ba is surrounded by a third gate conductor layer 29b (an example of a "third gate conductor layer" in the claims). A fourth gate insulating layer 26bb (an example of a "fourth gate insulating layer" in the claims) is formed so as to surround an upper portion of the second Si pillar 25b. The fourth gate insulating layer 26bb is surrounded by a fourth gate conductor layer 27b (an example of a "fourth gate conductor layer" in the claims). The third gate conductor layer 29b and the fourth gate conductor layer 27b are separated from each other by the third gate insulating layer 26ba, which is formed so as to be continuous over an upper surface of the third gate conductor layer 29b. The first wiring conductor layer 30 connected to the N$^+$ layer 21b is formed. The first wiring conductor layer 30 is separated from the second gate conductor layer 29a and the third gate conductor layer 29b by an insulating layer 28d. A second wiring conductor layer 34 connected to the N$^+$ layer 21c through a contact hole 33 is formed. An insulating layer 28a is formed on top of the N$^+$ layer 21a on the outer periphery of a bottom portion of the first Si pillar 25a, and an insulating layer 28b surrounding the first gate conductor layer 27a, an insulating layer 28c surrounding the second gate conductor layer 29a, the insulating layer 28d surrounding the first wiring conductor layer 30, an insulating layer 28e surrounding the third gate conductor layer 29b, an insulating layer 28f surrounding the fourth gate conductor layer 27b, and an insulating layer 28g surrounding the N$^+$ layer 21c and the contact hole 33 are formed. It is desirable that the first gate conductor layer 27a and the fourth gate conductor layer 27b be formed of the same conductive material layer. Likewise, it is desirable that the second gate conductor layer 29a and the third gate conductor layer 29b be formed of the same conductive material layer. It is also desirable that the first gate insulating layer 26aa and the fourth gate insulating layer 26bb be formed of the same insulating material layer. Likewise, it is desirable that the second gate insulating layer 26ab and the third gate insulating layer 26ba be formed of the same insulating material layer.

The N$^+$ layer 21a is connected to the first source line SL1, the first wiring conductor layer 30 connected to the N$^+$ layer 21b is connected to the first bit line BL1, the first gate conductor layer 27a is connected to the first plate line PL1, and the second gate conductor layer 29a is connected to the first word line WL1. The third gate conductor layer 29b is connected to a second word line WL2, the fourth gate conductor layer 27b is connected to a second plate line PL2, and the second wiring conductor layer 34 connected to the N$^+$ layer 21c is connected to a second source line SL2.

The first gate conductor layer 27a connected to the first plate line PL1, the second gate conductor layer 29a connected to the first word line WL1, the third gate conductor layer 29b connected to the second word line WL2, and the fourth gate conductor layer 27b connected to the second plate line PL2 are formed to extend in the same direction, namely, the X-X' line direction, in plan view. The first wiring conductor layer 30 connected to the first bit line BL1 is formed to extend in the Y-Y' line direction perpendicular to the first gate conductor layer 27a, the second gate conductor layer 29a, the third gate conductor layer 29b, and the fourth gate conductor layer 27b in plan view. As a result, the first dynamic flash memory cell is formed on the first Si pillar 25a, and the second dynamic flash memory cell is formed on the second Si pillar 25b, which shares the $N^+$ layer 21b connected to the first bit line BL1.

The second wiring conductor layer 34 connected to the second source line SL2 may be formed to extend in the X-X' line direction or the Y-Y' line direction in plan view. Alternatively, the second wiring conductor layer 34 may be formed to be continuous between second dynamic flash memory cells adjacent to each other in both the X-X' line direction and the Y-Y' line direction.

It is desirable that a first gate capacitance between the first gate conductor layer 27a and the P layer 22a be larger than a second gate capacitance between the second gate conductor layer 29a and the P layer 22a to stabilize the floating body voltage. Likewise, it is desirable that a third gate capacitance between the third gate conductor layer 29b and the P layer 22b be smaller than a fourth gate capacitance between the fourth gate conductor layer 27b and the P layer 22b to stabilize the floating body voltage. Further, it is desirable that the first gate capacitance be equal to the fourth gate capacitance and the second gate capacitance be equal to the third gate capacitance to allow the first dynamic flash memory cell and the second dynamic flash memory cell to operate at the same drive voltage. The first to fourth gate capacitances are related to the gate length in the vertical direction, and the gate length is processed with accuracy that does not cause a problem in operation. The thicknesses of the first to fourth gate insulating layers are also processed with accuracy that does not cause a problem in operation.

It is desirable that the first gate insulating layer 26aa and the fourth gate insulating layer 26bb be formed of the same material layer to make the first gate capacitance and the fourth gate capacitance equal to each other. Likewise, it is desirable that the second gate insulating layer 26ab and the third gate insulating layer 26ba be formed of the same material layer to make the second gate capacitance and the third gate capacitance equal to each other.

In FIGS. 5A to 5C, the first Si pillar 25a and the second Si pillar 25b having a rectangular vertical cross section are used. However, the vertical cross section shape of the first Si pillar 25a and the second Si pillar 25b may be formed to be trapezoidal. The portions of the first Si pillar 25a surrounded by the first gate insulating layer 26aa and the second gate insulating layer 26ab may have different shapes such as a rectangular shape and a trapezoidal shape. Likewise, the portions of the second Si pillar 25b surrounded by the third gate insulating layer 26ba and the fourth gate insulating layer 26bb may have different shapes such as a rectangular shape and a trapezoidal shape.

In FIG. 1, even if the first gate conductor layer 5a surrounds a portion of the first gate insulating layer 4a, the dynamic flash memory operation can be performed. Even if the first gate conductor layer 5a is divided into a plurality of conductor layers and the conductor layers are driven synchronously or asynchronously at the same drive voltage or different drive voltages, the dynamic flash memory operation can be performed. Likewise, even if the second gate conductor layer 5b is divided into a plurality of conductor layers and the conductor layers are driven synchronously or asynchronously at the same drive voltage or different drive voltages, the dynamic flash memory operation can be performed. The same applies to FIGS. 5A to 5C.

In FIG. 1, the first gate conductor layer 5a connected to the first plate line PL1 is disposed adjacent to the $N^+$ layer 3a connected to the first source line SL1, and the second gate conductor layer 5b connected to the first word line WL1 is disposed adjacent to the $N^+$ layer 3b connected to the first bit line BL1. Alternatively, the second gate conductor layer 5b connected to the first word line WL1 may be disposed adjacent to the $N^+$ layer 3a, and the first gate conductor layer 5a connected to the first plate line PL1 may be disposed adjacent to the $N^+$ layer 3b. This also allows a dynamic flash memory operation to be performed. The same applies to FIGS. 5A to 5C. In this case, the positions of the first gate conductor layer 27a and the second gate conductor layer 29a in the vertical direction are interchanged, and the positions of the fourth gate conductor layer 27b and the third gate conductor layer 29b in the vertical direction are interchanged.

Further, in FIGS. 5A to 5C, a common source line may be connected to the $N^+$ layer 21b, and the $N^+$ layers 21a and 21c may be connected to independent bit lines. A dynamic flash memory operation can be performed.

In FIG. 1, the $N^+$ layer 3a may extend over the substrate 1 to serve also as a wiring conductor layer for the first source line SL1. Alternatively, a conductor layer such as a W layer may be connected to the $N^+$ layer 3a. The same applies to FIGS. 5A to 5C.

In FIGS. 5A to 5C, the $N^+$ layer 21a may be formed to be connected to an $N^+$ layer at the bottom portion of an adjacent first Si pillar. In this case, the second wiring conductor layer 34 connected to the $N^+$ layer 21c at the top portion of the second Si pillar 25b is also connected to an $N^+$ layer at the top portion of an adjacent second Si pillar. The $N^+$ layer 21a may be electrically isolated from the $N^+$ layer at the bottom portion of the adjacent first Si pillar by using, for example, STI (Shallow Trench Isolation) or a well structure. In this case, the second wiring conductor layer 34 connected to the $N^+$ layer 21c at the top portion of the second Si pillar 25b is also electrically isolated from the $N^+$ layer at the top portion of the adjacent second Si pillar.

In FIG. 1, even a structure in which the $N^+$ layers 3a and 3b and the P layer 7 have conductivity types reversed in polarity from that described above can also implement the dynamic flash memory operation. In this case, electrons are majority carriers in the Si pillar 2. Accordingly, the electron group generated by impact ionization is stored in the channel region 8, and the "1" state is set. The same applies to FIGS. 5A to 5C.

This embodiment provides the following features.
(Feature 1)

As illustrated in FIGS. 5A to 5C, the first dynamic flash memory cell formed on the first Si pillar 25a and the second dynamic flash memory cell formed on the second Si pillar 25b are formed to overlap each other in the vertical direction in plan view. As a result, two dynamic flash memory cells can be formed without increasing the area of the cells. As a result, a high-integration dynamic flash memory can be achieved.

(Feature 2)

As illustrated in FIGS. 5A to 5C, the N+ layer 21b at the top portion of the first Si pillar 25a also serves as an N+ layer connected to the first bit line BL1 of the first dynamic flash memory cell and the second dynamic flash memory cell. Thus, the manufacturing process of the dynamic flash memory can be simplified and facilitated.

Other Embodiments

The first gate conductor layer 5a connected to the first plate line PL1 may be a single conductive material layer or a combination of a plurality of conductive material layers including polycrystalline Si containing a large amount of donor or acceptor impurity. Likewise, the second gate conductor layer 5b connected to the first word line WL1 may be formed of a single conductive material layer or a combination of a plurality of conductive material layers. The outer side of the first or second gate conductor layer 5a or 5b may be connected to a wiring metal layer such as W. This also applies to the embodiment illustrated in FIGS. 5A to 5C.

In FIG. 1, the first gate conductor layer 5a connected to the first plate line PL1 has a longer gate length than the second gate conductor layer 5b connected to the first word line WL1 so that the gate capacitance of the first gate conductor layer 5a can be larger than the gate capacitance of the second gate conductor layer 5b. Alternatively, a gate insulating film of the first gate insulating layer 4a may have a smaller thickness than a gate insulating film of the second gate insulating layer 4b instead of the first gate conductor layer 5a having a longer gate length than the second gate conductor layer 5b. Alternatively, the first gate insulating layer 4a may have a higher dielectric constant than the second gate insulating layer 4b. Further, any of the lengths of the first gate conductor layer 5a and the second gate conductor layer 5b, the thicknesses of the first gate insulating layer 4a and the second gate insulating layer 4b, and the dielectric constants of the first gate insulating layer 4a and the second gate insulating layer 4b may be combined so that the gate capacitance of the first gate conductor layer 5a can be larger than the gate capacitance of the second gate conductor layer 5b. This also applies to the embodiment illustrated in FIGS. 5A to 5C.

In FIG. 1, the vertical length of the first gate conductor layer 5a to which the first plate line PL1 is connected is set to be longer than the vertical length of the second gate conductor layer 5b to which the first word line WL1 is connected such that $C_{PL} > C_W$ is met. However, only addition of the first plate line PL1 results in a reduction in the capacitive coupling ratio of the first word line WL1 to the channel region 8 ($C_{WL}/(C_{BL}+C_{WL}+C_{BL}+C_{SL})$). As a result, the potential variation $\Delta V_{FB}$ of the channel region 8 of the floating body is reduced. This also applies to the embodiment illustrated in FIGS. 5A to 5C.

In the description of FIGS. 2A to 4BD, as the voltage of the first plate line PL1, for example, a fixed voltage of 2 V may be applied regardless of the operation mode. As the voltage of the first plate line PL1, for example, 0 V may be applied only at the time of erasing. The voltage of the first plate line PL1 may be a fixed voltage or a voltage that changes with time as long as the voltage satisfies a condition in which a dynamic flash memory operation can be performed.

In FIG. 1, the Si pillar 2 has a circular shape in plan view. The Si pillar 2 may have a shape other than a circular shape, such as an elliptical shape or a shape elongated in one direction. This also applies to the embodiment illustrated in FIGS. 5A to 5C.

In the description of this embodiment, at the time of the data erase operation, the first source line SL1 is negatively biased to extract the hole group in the channel region 8, which is the floating body FB. The data erase operation may be performed with the first bit line BL1 negatively biased instead of the first source line SL1 or with both the first source line SL1 and the first bit line BL1 negatively biased. Alternatively, the data erase operation may be performed under other voltage conditions.

In FIG. 1, an N-type or P-type impurity layer having a different acceptor impurity concentration may be disposed between the N+ layer 3a and the P layer 7. Alternatively, an N-type or P-type impurity layer may be disposed between the N+ layer 3b and the P layer 7. This also applies to the embodiment illustrated in FIGS. 5A to 5C.

In FIG. 1, the N+ layers 3a and 3b may be formed of layers made of Si or any other semiconductor material containing a donor impurity. The N+ layer 3a and the N+ layer 3b may be formed as different semiconductor material layers. This also applies to the embodiment illustrated in FIGS. 5A to 5C.

In FIG. 1, the first Si pillar 2 may be two-dimensionally arranged in a square lattice shape, an oblique lattice shape, or a zigzag shape. This also applies to the embodiment illustrated in FIGS. 5A to 5C.

In FIG. 1, a P layer, an SOI, or a multi-layer well may be used as the substrate 1. This also applies to the embodiment illustrated in FIGS. 5A to 5C.

Various embodiments and modifications can be made to the present invention without departing from the broad spirit and scope of the present invention. The embodiment described above is for explaining an example of the present invention, and do not limit the scope of the present invention. The embodiment and modifications described above can be combined as desired. Some of the components may be removed as necessary from the embodiment described above to form other embodiments within scope of the technical idea of the present invention.

INDUSTRIAL APPLICABILITY

With a memory device using a semiconductor element according to the present invention, a high-density and high-performance dynamic flash memory can be obtained.

The invention claimed is:

1. A memory device using a semiconductor element, comprising:
    a first semiconductor pillar standing on a substrate in a vertical direction to the substrate, the first semiconductor pillar including, from bottom to top, a first impurity layer, a first semiconductor layer, and a second impurity layer;
    a second semiconductor pillar on top of the first semiconductor pillar in such a manner as to be connected to the first semiconductor pillar in the vertical direction, the second semiconductor pillar including, from bottom to top, the second impurity layer, a second semiconductor layer, and a third impurity layer, the second impurity layer being shared with the first semiconductor pillar;
    a first gate insulating layer surrounding a lower portion of the first semiconductor pillar;
    a first gate conductor layer surrounding the first gate insulating layer;

a second gate insulating layer surrounding an upper portion of the first semiconductor pillar;
a second gate conductor layer surrounding the second gate insulating layer;
a third gate insulating layer surrounding a lower portion of the second semiconductor pillar;
a third gate conductor layer surrounding the third gate insulating layer;
a fourth gate insulating layer surrounding an upper portion of the second semiconductor pillar; and
a fourth gate conductor layer surrounding the fourth gate insulating layer, wherein
the memory device is configured to perform:
a data write operation for controlling voltages to be applied to the first gate conductor layer, the second gate conductor layer, the third gate conductor layer, the fourth gate conductor layer, the first impurity layer, the second impurity layer, and the third impurity layer to form, in both or one of the first semiconductor layer and the second semiconductor layer, a hole group or an electron group serving as majority carriers of both or one of the first semiconductor layer and the second semiconductor layer, the hole group or the electron group being formed by an impact ionization phenomenon or a gate induced drain leakage current, and to hold the formed hole group or electron group in both or one of the first semiconductor layer and the second semiconductor layer; and
a data erase operation for controlling the voltages to be applied to the first gate conductor layer, the second gate conductor layer, the third gate conductor layer, the fourth gate conductor layer, the first impurity layer, the second impurity layer, and the third impurity layer to discharge the hole group or the electron group serving as majority carriers from within both or one of the first semiconductor layer and the second semiconductor layer.

2. The memory device using a semiconductor element according to claim 1, wherein
the first impurity layer is connected to a first source line,
the first gate conductor layer is connected to a first plate line,
the second gate conductor layer is connected to a first word line,
the second impurity layer is connected to a first bit line,
the third gate conductor layer is connected to a second word line,
the fourth gate conductor layer is connected to a second plate line,
the third impurity layer is connected to a second source line, and
in plan view, the first word line and the second word line extend in a first direction, and the first bit line extends in a second direction perpendicular to the first direction.

3. The memory device using a semiconductor element according to claim 1, wherein
the first impurity layer is connected to a first source line,
the first gate conductor layer is connected to a first word line,
the second gate conductor layer is connected to a first plate line,
the second impurity layer is connected to a first bit line,
the third gate conductor layer is connected to a second plate line,
the fourth gate conductor layer is connected to a second word line,
the third impurity layer is connected to a second source line, and
in plan view, the first word line and the second word line extend in a first direction, and the first bit line extends in a second direction perpendicular to the first direction.

4. The memory device using a semiconductor element according to claim 1, wherein
the first impurity layer is connected to a first bit line,
the first gate conductor layer is connected to a first word line,
the second gate conductor layer is connected to a first plate line,
the second impurity layer is connected to a first source line,
the third gate conductor layer is connected to a second plate line,
the fourth gate conductor layer is connected to a second word line,
the third impurity layer is connected to a second bit line, and
in plan view, the first word line and the second word line extend in a first direction, and the first bit line and the second bit line extend in a second direction perpendicular to the first direction.

5. The memory device using a semiconductor element according to claim 1, wherein
the first impurity layer is connected to a first bit line,
the first gate conductor layer is connected to a first plate line,
the second gate conductor layer is connected to a first word line,
the second impurity layer is connected to a first source line,
the third gate conductor layer is connected to a second word line,
the fourth gate conductor layer is connected to a second plate line,
the third impurity layer is connected to a second bit line, and
in plan view, the first word line and the second word line extend in a first direction, and the first bit line and the second bit line extend in a second direction perpendicular to the first direction.

6. The memory device using a semiconductor element according to claim 1, wherein
the first gate conductor layer and the fourth gate conductor layer are formed of the same conductive material layer, and
the second gate conductor layer and the third gate conductor layer are formed of the same conductive material layer.

7. The memory device using a semiconductor element according to claim 1, wherein
the first gate insulating layer and the fourth gate insulating layer are formed of the same insulating material layer, and
the second gate insulating layer and the third gate insulating layer are formed of the same insulating material layer.

8. The memory device using a semiconductor element according to claim 1, wherein
a first gate capacitance between the first gate conductor layer and the first semiconductor layer is larger than a second gate capacitance between the second gate conductor layer and the second semiconductor layer, and a third gate capacitance between the third gate conductor layer and the second semiconductor layer is smaller than a fourth gate capacitance between the fourth gate conductor layer and the second semiconductor layer.

9. The memory device using a semiconductor element according to claim 8, wherein the first gate capacitance and the fourth gate capacitance are equal to each other, and the second gate capacitance and the third gate capacitance are equal to each other.

* * * * *